US006365431B1

(12) United States Patent
Hanehira et al.

(10) Patent No.: US 6,365,431 B1
(45) Date of Patent: Apr. 2, 2002

(54) METHOD OF MANUFACTURING A PHOTOVOLTAIC DEVICE

(75) Inventors: Nobuo Hanehira, Tunagun; Yoshinori Wakamiya, Sumoto; Hidekazu Shuto, Miharagun; Hiroyuki Mori, Tunagun; Masayoshi Ono, Sumoto; Wataru Shinohara, Katano; Yasuaki Yamamoto, Nara, all of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/722,736

(22) Filed: Nov. 28, 2000

(30) Foreign Application Priority Data

Nov. 30, 1999 (JP) ............................................. 11-340116

(51) Int. Cl.[7] .............................................. H01L 21/00
(52) U.S. Cl. ....................................................... 438/98
(58) Field of Search ............................... 438/48, 69, 96, 438/97, 98, 940, 945; 136/244, 249, 252, 258, 261

(56) References Cited

U.S. PATENT DOCUMENTS 4,713,518 A  12/1987  Yamazaki et al.

FOREIGN PATENT DOCUMENTS

JP          10-107305         *  4/1998

* cited by examiner

*Primary Examiner*—Keith Christianson
(74) *Attorney, Agent, or Firm*—Wenderoth, Lind & Ponack, L.L.P.

(57) ABSTRACT

This invention manufactures a photovoltaic device by the following process steps: a step to form a first electrode layer and a light-active semiconductor layer on an insulating surface of the substrate; a step to form a transparent conducting film over most of the insulating surface including the light-active semiconductor layer; a step to establish a patterned transparent protective layer on the transparent conducting film over power generating regions; and a step to irradiate ultraviolet laser light over most of the substrate to remove exposed portions of the transparent conducting film not masked by the pattered transparent protective layer and form a transparent conducting layer corresponding to the pattered transparent protective layer. The patterned transparent protective layer serves a dual purpose as masking material for removing the specified areas of the transparent conducting film by ultraviolet laser and as a transparent protective layer. Accordingly, material that is passed by visible light but not passed by ultraviolet light is used as the patterned transparent protective layer.

28 Claims, 9 Drawing Sheets

METHOD OF MANUFACTURING A PHOTOVOLTAIC DEVICE

This application is based on application No.11-340116 filed in Japan on Nov. 30, 1999, the content of which is incorporated hereinto by reference.

BACKGROUND OF THE INVENTION

This invention relates to a method of manufacturing a photovoltaic device.

A prior art method of manufacturing a photovoltaic device is disclosed In Japanese Non-examined Patent Publication No.10-107305 issued on Apr. 24, 1998. This method of manufacture forms a first electrode film, a light-active semiconductor film, and a transparent conducting film over the whole surface of an insulating substrate. Subsequently, by scanning a spot laser beam to form dividing grooves, layered structures corresponding to a plurality of power generating regions are formed.

In prior-art photovoltaic devices described above, a top surface protective film is necessary to further improve reliability. However, the laser-formed dividing grooves for dividing the power generating regions are approximately 50 $\mu$m to 100 $\mu$m wide. When the devices having the above protective film are used for long period or subjected to reliability testing, the protective film delaminates In the dividing grooves and moisture intrusion can occur.

SUMMARY OF THE INVENTION

The present Invention was developed to solve these types of problems, It is thus an object of the present invention to provide a method of manufacturing a photovoltaic device which Is easy to manufacture and delivers good reliability.

The above and further objects and features of the invention will more fully be apparent from the following detailed description with accompanying drawings.

The present invention is a method of manufacturing a photovoltaic device which forms a first electrode layer, a light-active semiconductor layer, and a transparent conducting layer in power generating regions on a substrate having an insulating top surface.

The method of manufacture of the present invention comprises the following steps; forming said first electrode layer and said light-active semiconductor layer on the insulating surface; forming a transparent conducting film over most of the insulating surface including the region of the light-active semiconductor layer, said transparent conducting film constituting said transparent conducting layer; forming a patterned transparent protective layer being passed by visible light but not passed by ultraviolet light, as masking material on said transparent conducting film over said power generating regions; and forming said transparent conducting layer by removing portions of said transparent conducting film not masked by the patterned transparent protective layer by irradiating ultraviolet laser light over most of the substrate,whereby after the above steps, said patterned transparent protective layer is left.

In the method of manufacture of the present invention, protective material can be disposed in the portions of the transparent conducting film removal for additional protection. Further, the method of manufacture of the present invention uses polyethylene terephthalate resin as the transparent protective layer.

In the method of manufacture described above, protective layer, which is selectively passed by visible light but not passed by ultraviolet light, masks the transparent conducting film. The transparent conducting layer is patterned and formed by removing portions of the transparent conducting film not masked by the patterned transparent protective layer by irradiating ultraviolet laser light over most of the substrate. The transparent protective layer is not removed after irradiation of ultraviolet laser light because it serves as a protective film covering the transparent conducting layer. Specifically, the transparent protective layer, which protects the device, is used as masking material for partial removal of the transparent conducting film. A photovoltaic device manufactured by this method Is protected by the transparent protective layer and has Improved reliability.

In a method which further protects the device by disposing protective material in the portions of the transparent conducting film removal, the protective material can achieve sufficient adhesion to the light-active semiconductor layer over a wide area. This is because the width of the regions where the transparent conducting film is removed by the reason of not masked by protective layer can be made wider than the prior-art technology dividing grooves (50 $\mu$m to 100 $\mu$m) created by spot laser beam. Consequently, protective material delamination and moisture ingress in these regions can be reduced over long duration use or reliability testing for a photovoltaic device manufactured by this method.

BRIEF DESCRIPTION OF THE DRAWINGS

FIG. 3(*a*) is a plan view showing the second process step of an embodiment of the present invention, and (*b*) is a cross-section view at A—A in plan view (*a*).

FIG. 4(*a*) is a plan view showing the third process step of an embodiment of the present invention, and (b) is a cross-section at A—A in plan view (*a*).

FIG. 5(*a*) is a plan view showing the fourth process step of an embodiment of the present invention, and (*b*) is a cross-section at A—A in plan view (*a*).

FIG. 6(*a*) is a plan view showing the fifth process step of an embodiment of the present invention, and (*b*) is a cross-section at A—A in plan view (*a*).

FIG. 7(*a*) is a plan view showing the sixth process step of an embodiment of the present invention, and (*b*) is a cross-section at A—A in plan view (*a*).

FIG. 8(*a*) is a plan view showing the seventh process step of an embodiment of the present invention, and (*b*) is a cross-section at A—A in plan view (*a*).

FIG. 9(*a*) is a plan view showing the eighth process step of an embodiment of the present invention, and (*b*) is a cross-section at A—A in plan view (*a*).

DETAILED DESCRIPTION OF THE INVENTION

The following describes in detail an embodiment of the method of manufacture of the present invention with reference to FIGS. 1 through 9.

Figure 1A:
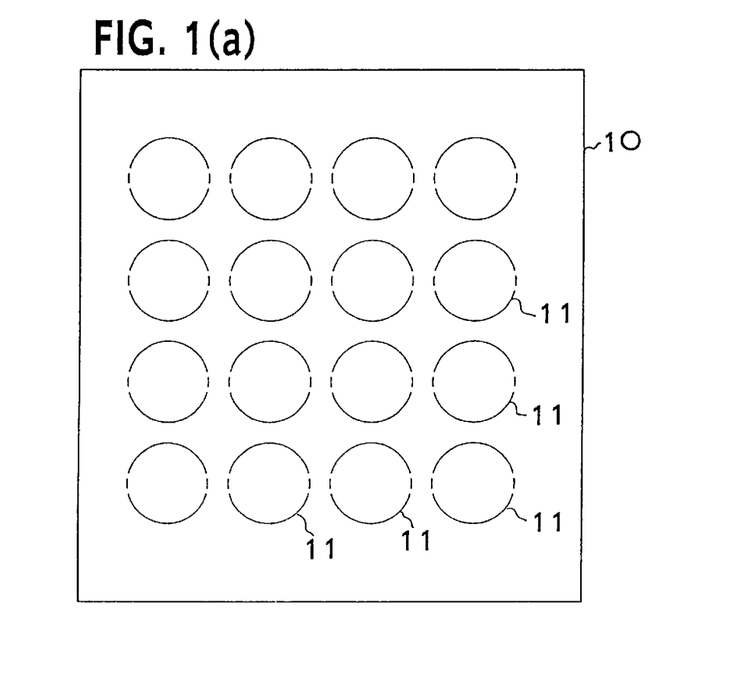
FIG. 1 is a plan view showing a substrate used for the present invention.
Figure 1B:
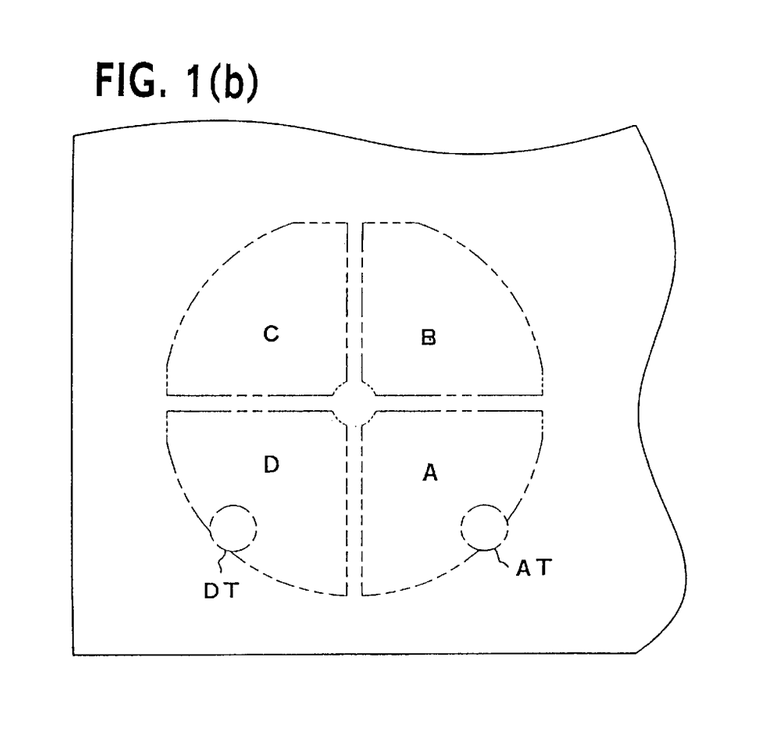

First turning to FIG. 1, a substrate 10 used in this embodiment is shown. As shown In FIG. 1(*a*), the substrate 10 is a flexible rectangular metal sheet, such as stainless steel or aluminum with an insulating resin film such as polyimide formed on top, or a film substrate made of a resin such as polyamide. This substrate may be either transparent or opaque. In FIG. 1(a), substrate regions encircled with broken lines 11, 11, . . . , are regions in which photovoltaic devices are formed. FIG. 1(b) shows the lower left corner of the substrate 10. Regions A through D delineated by broken lines in FIG. 1(b) are power generating regions, which are a stacked layer body of a first electrode layer, a light-active semiconductor layer, and a transparent conducting layer as described below. Finally, AT is the positive electrode terminal area and DT is the negative electrode terminal area.

The remaining FIGS. 2 through 9 show manufacturing process steps for the photovoltaic device near the lower left corner of the substrate 10. Since manufacturing process steps for all other photovoltaic devices are the same as shown in these figures, their description is abbreviated.

Figure 2:
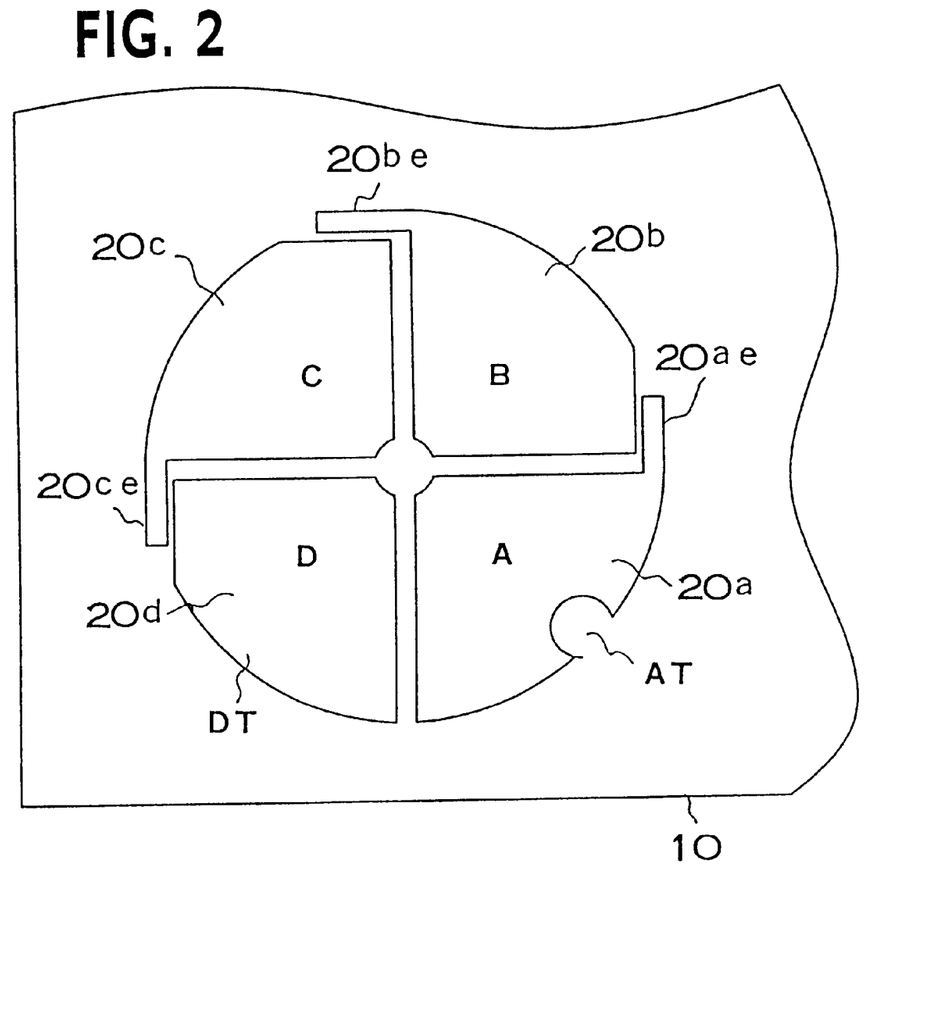
FIG. 2 is a plan view showing the first process step of an embodiment of the present invention.

Turning to the process step shown in FIG. 2, the first electrode layer 20a through 20d is formed respectively corresponding to the power generating regions A through D. These first electrode layer 20a through 20d are each fan-shaped with a central angle of approximately 90°. The first electrode layer 20a through 20d are disposed with spaces of prescribed width between them and form an circular shape as a whole. Further, each of the first electrode layers 20a, 20b, and 20c has a connecting region 20ae, 20be, and 20ce which extends outside the periphery of the adjacent power generating region B, C, and D respectively. The first electrode layers 20a through 20d have a thickness from 0.1 $\mu$m to 1.0 $\mu$m, and are made of metal films such as tungsten, aluminum, titanium, nickel, or copper, etc. in addition, the first electrode layer 20d extends into the negative electrode terminal area DT. Conversely, a first electrode layer is not disposed in the positive electrode terminal area AT.

Figure 3A:
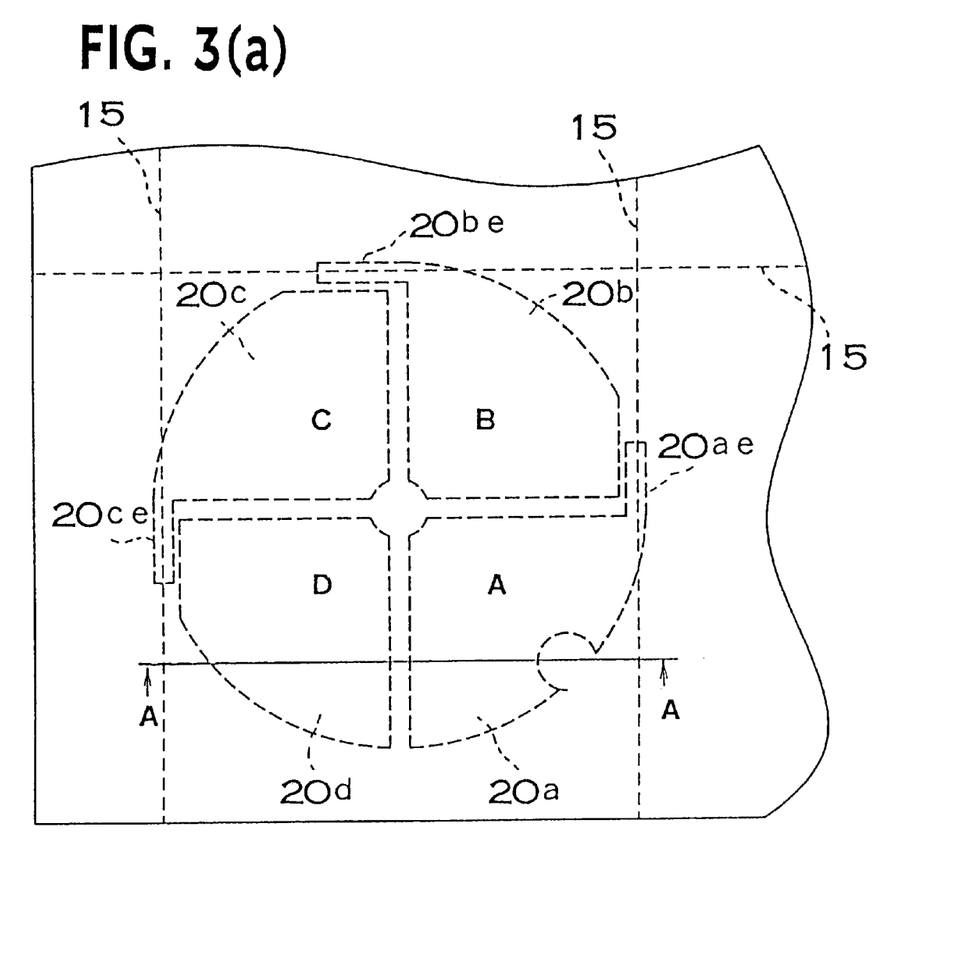
Figure 3B:
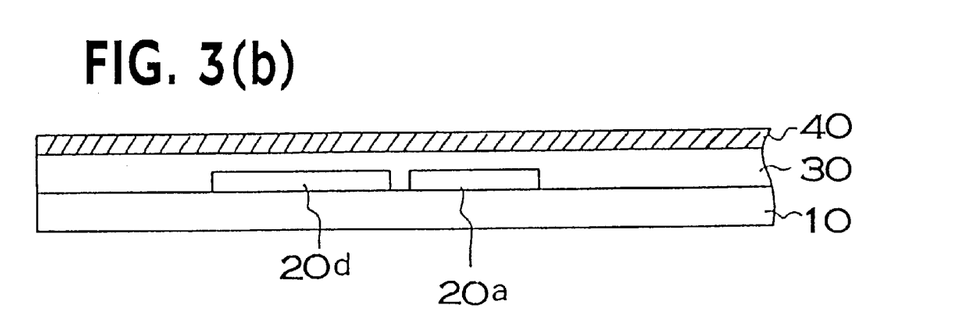

Next, in the process step shown in FIG. 3, the light-active semiconductor layer 30, which is a pn or pin-type layered-structure of amorphous silicon, amorphous silicon-carbide, or amorphous silicon-germanium, etc., is formed over most of the substrate 10 with a thickness from 0.3 $\mu$m to 1.0 $\mu$m. Subsequently, a transparent conducting film 40, which constitutes the transparent conducting layer described below, is formed over most of the light-active semiconductor layer 30. This transparent conducting film 40 is a transparent conducting film of zinc oxide (ZnO), indium tin oxide (ITO), or tin oxide (SnO$_2$), etc. with a thickness from 400 Å to 10000 Å.

Each of the first electrode layer connecting regions 20ae, 20be, and 20ce are next laser-welded and electrically connected to the transparent conducting film 40 by linearly scanning a YAG laser (1.06 $\mu$m wavelength) parallel to the sides of the substrate 10 and positioned over the transparent conducting film 40 above the first electrode layer connecting regions 20ae, 20be, and 20ce. The laser-welded regions are in the form of spots approximately 50 $\mu$m to 80 $\mu$m in diameter. Since the photovoltaic devices at this process step of the present embodiment are positioned on the substrate 10 in the regions 11, 11, . . . as shown in FIG. 1, the connecting regions of the first electrode layer and the transparent conducting film 40 for all other photovoltaic devices being processed are electrically connected by linear scanning of the YAG laser as described above instead of the YAG laser being linearly scanned, a laser device capable of spot irradiation only over the first electrode layer connecting regions 20ae, 20be, and 20ce can be used to laser-weld and electrically connect the electrodes.

Figure 4A:
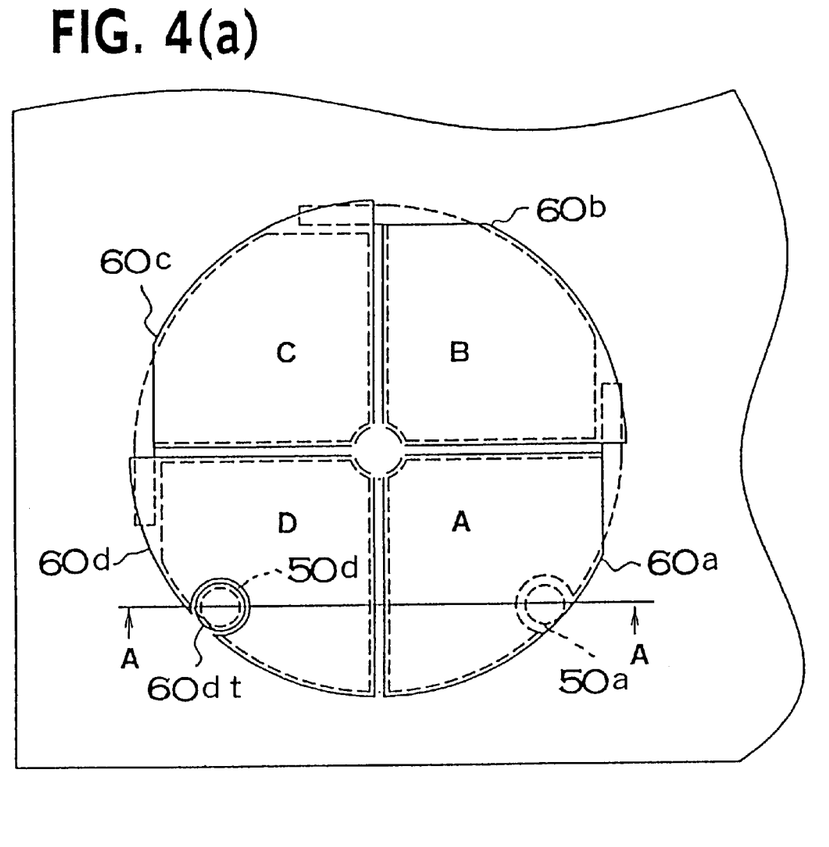
Figure 4B:
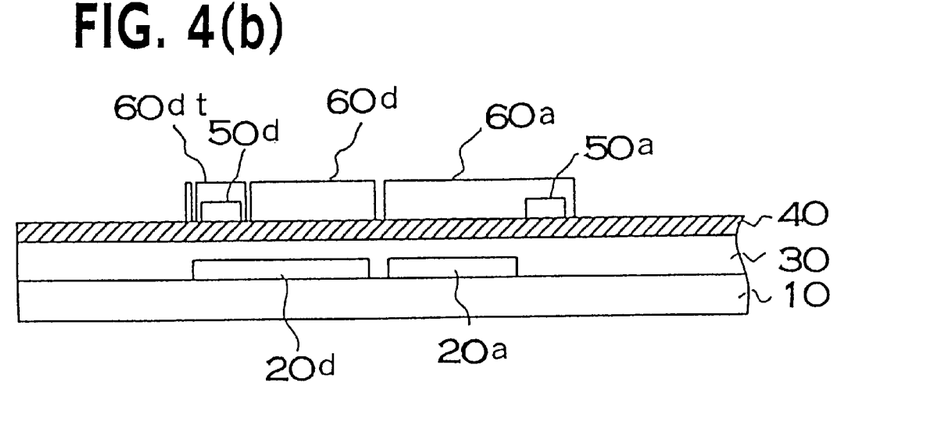

Next in the process step shown in FIG. 4, conducting paste electrodes 50a and 50d are formed over the transparent conducting film 40 in the positive electrode terminal area AT and the negative electrode terminal area DT respectively.

These conducting paste electrodes 50a and 50d are formed with film thickness from 20 $\mu$m to 60 $\mu$m by several repetitions of the following screen printing method. This conducting paste is a polyimide, phenol, or epoxy based binder which includes a conducting powder such as silver, nickel, or aluminum, etc. After patterning the electrode terminals of the conducting paste by screen printing, the conducting paste is baked dry at 150° C. After one printing and drying cycle, a film of the conducting paste typically 10 $\mu$m to 20 $\mu$m in height is formed. However, by optimizing printing conditions and materials etc., it is possible to obtain the desired film thickness of 20 $\mu$m to 60 $\mu$m in one screening.

Next, a patterned transparent protective layers 60a through 60d, which are passed by visible light but not passed by ultraviolet light, is disposed over the transparent conducting film 40 corresponding to each of the power generating regions A through D. Further, the patterned transparent protective layer 60a extends over the electrode terminal area AT, and in the electrode terminal area DT a transparent protective layer 60dt having an approximately circular shape is disposed separately from the transparent protective layer 60d. This transparent protective layers are patterned by screen printing and heat-drying the starting material of polyethylene terephthalate (PET) resin 3 $\mu$m to 6 $\mu$m in the layer thickness). Gap widths between the adjacent patterned transparent protective layers are desirably greater than or equal to approximately 0.2 mm, and are set at approximately 0.4 mm in this embodiment.

Figure 5A:
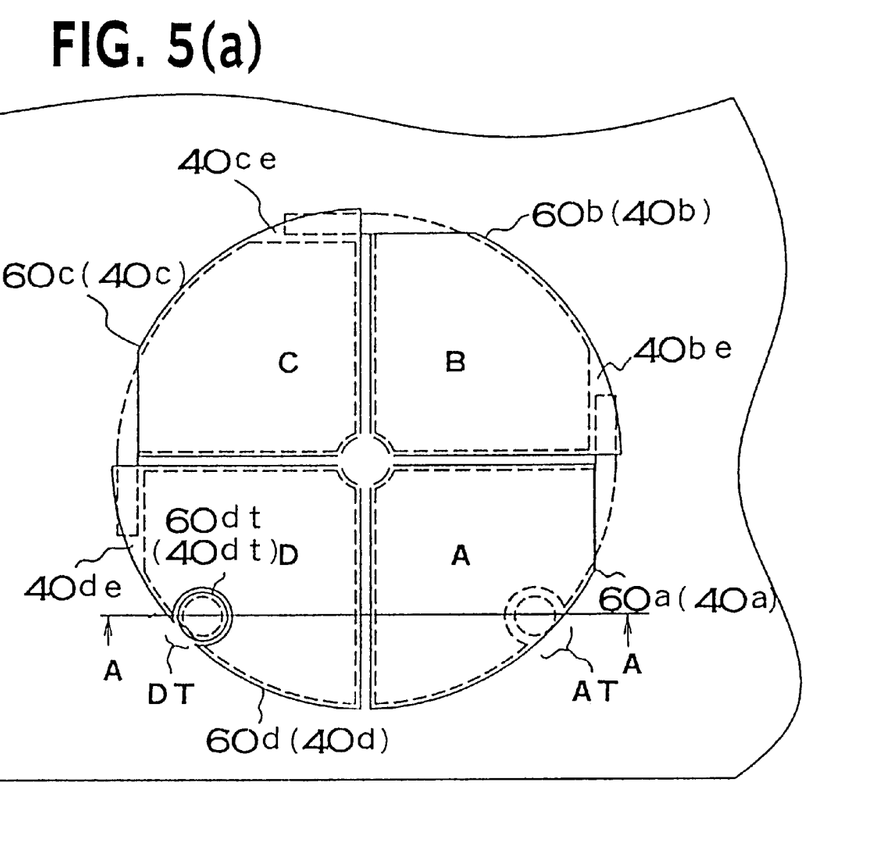
Figure 5B:
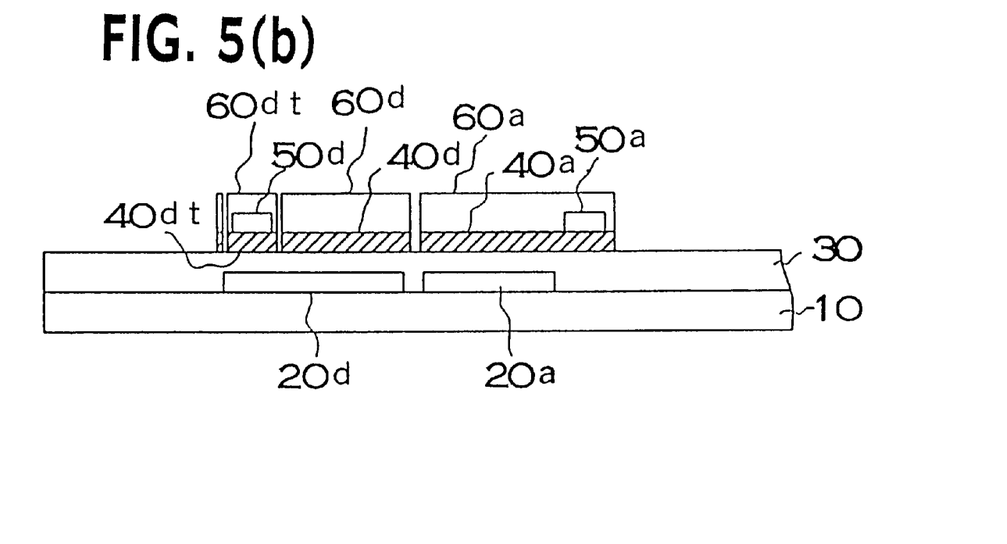

Next in the process step shown in FIG. 5, a sheet-beam of ultraviolet laser light, which is a sheet-beam of eximer laser (KrF laser, 249 nm) light, is scanned over the substrate 10 to Irradiate It over most of the substrate 10 surface.

As a result of this process step, exposed portions of the transparent conducting film 40, which are not covered by the transparent protective layers 60a through 60d and 60dt being visible light transparent and ultra-violet light blocking, is removed. Transparent conducting layers 40a through 40d and 40dt are thereby formed corresponding to each of the transparent protective layer 60a through 60d and 60dt. Here, eximer laser parameters are set considering scanning speed and width of the sheet-beam etc. so as to sufficiently remove exposed portions of the transparent conducting film 40. In this embodiment, ITO of about 700 Å was used for the transparent conducting film 40, and exposed ITO transparent conducting film 40 could be sufficiently removed with KrF laser parameters of 1.0 to 1.6 J/pulse output, 150 mm sheet-beam length, 0.4 mm sheet-beam width (i.e. 0.017~0.027 J/(pulse.mm$^2$), 30 Hz pulse rate, and 12 mm/sec scanning speed.

As a result of investigation of materials of the transparent protective layers for use in this embodiment, eximer laser (KrF laser) light passed through acrylic resin damaging the power generating regions and degrading the device output characteristics. Further, it was confirmed that polyethylene terephthalate (PET) resin with film thickness greater than or equal to 3 $\mu$m resulted in no damage to the power generating regions, but less than 3 $\mu$m resulted in power generating region damage and output characteristic degradation.

The transparent conducting layers 40b, 40c, and 40d have connecting regions 40be, 40ce, and 40de facing the first electrode layer connecting regions 20ae, 20be, and 20ce respectively through the light-active semiconductor layer 30. Each of these connecting regions 40be, 40ce, and 40de is electrically connected to the adjacent first electrode layers by previous laser-welding through the first electrode layer connecting regions 20ae, 20be, and 20ce.

Figure 6A:
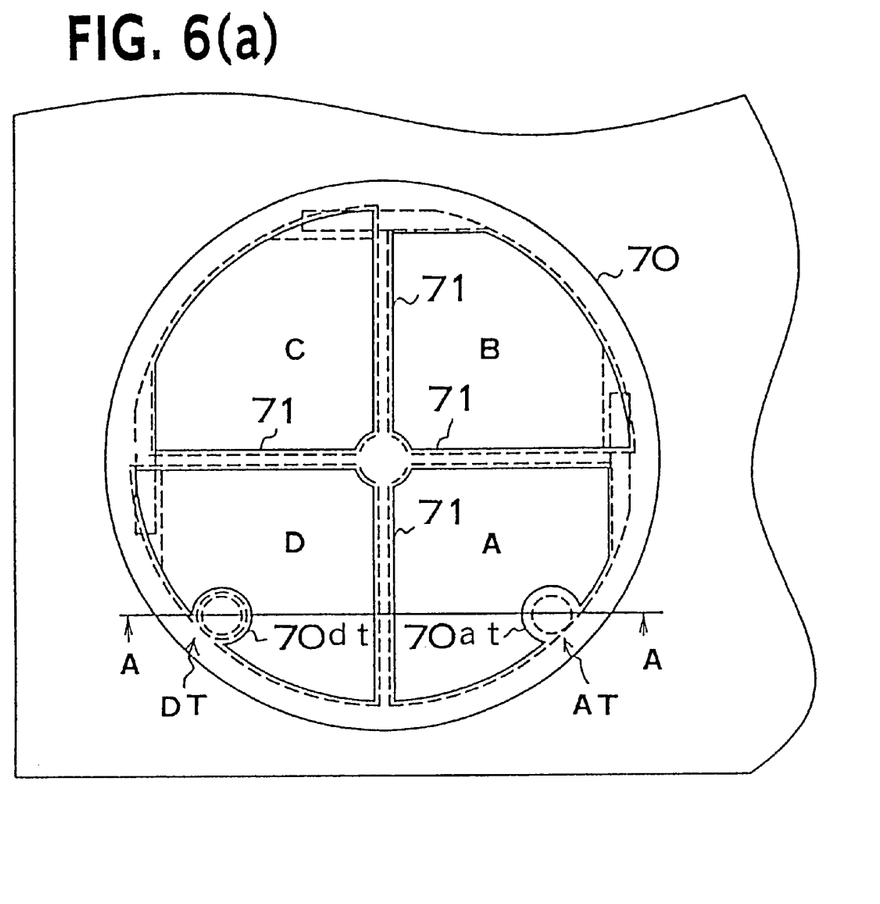
Figure 6B:
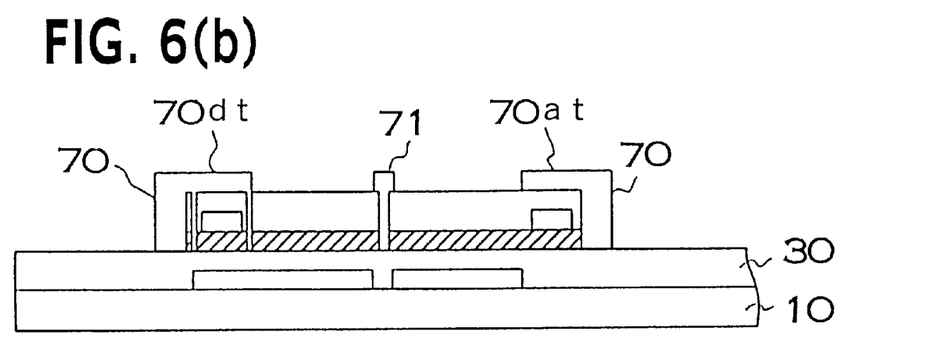

Next in the process step shown in FIG. 6, protective materials 70, 71, 70at, and 70dt in gaps between each of the power generating regions A through D and over the terminal areas AT and DT are formed by screen-printing. Resin such as acrylic or polyethylene terephthalate (PET) with film thickness 2 $\mu$m to 10 $\mu$m can be used as this protective material resin. The protective material may be either transparent or with coloration. When brownish color is added to the protective material. It has the same type of coloration as the amorphous silicon light-active semiconductor layer 30 and color contrast over the light-receiving surface of the photovoltaic device can be reduced. This can result in a pleasing external appearance when the photovoltaic device is used as power source for a watch or clock.

Figure 7A:
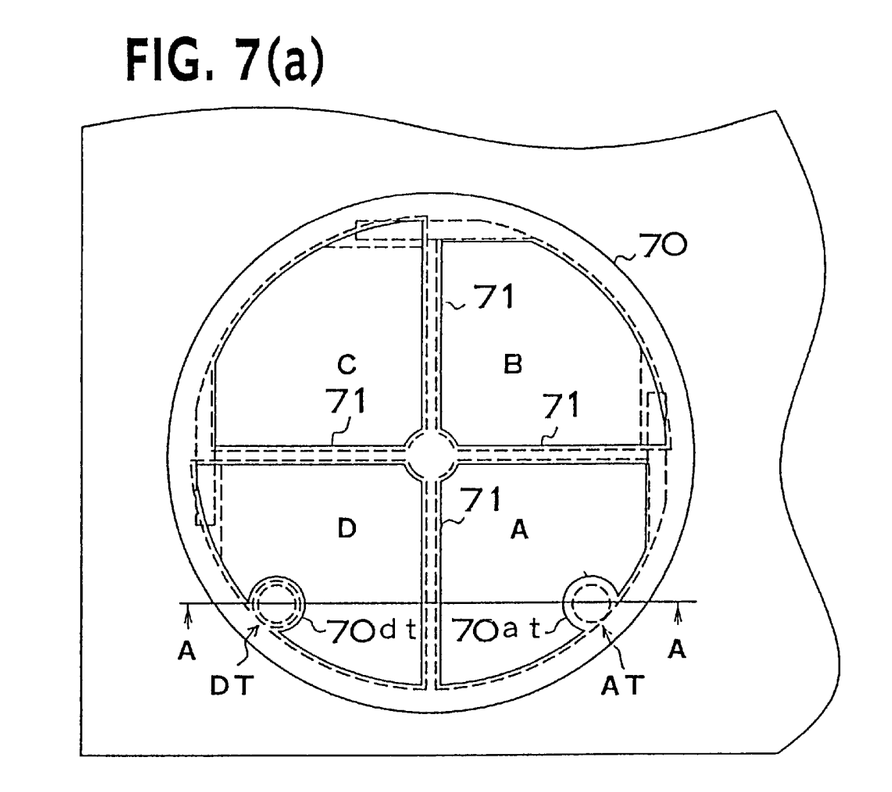
Figure 7B:
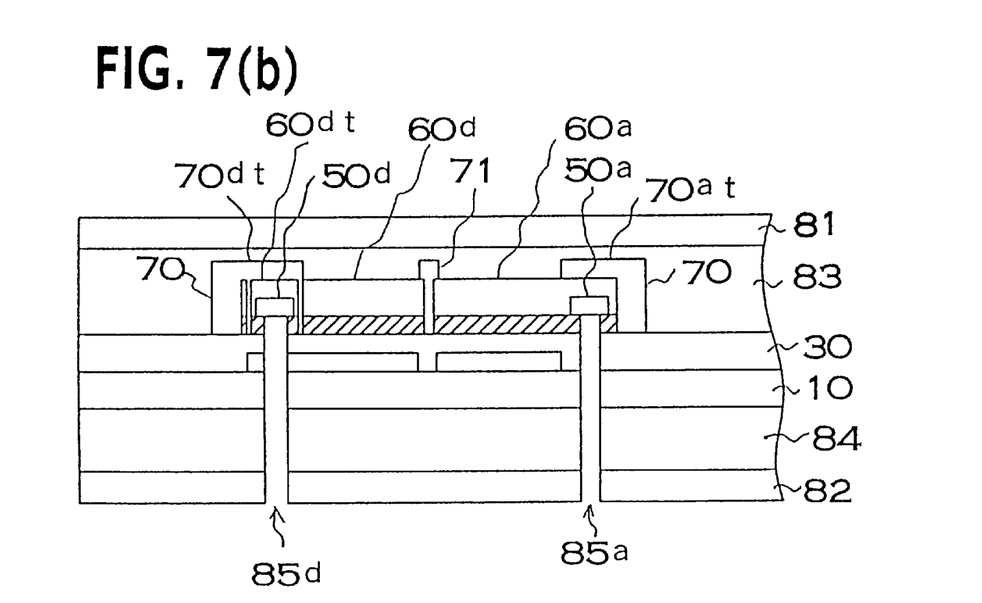

Next in the process step shown in FIG. 7, a transparent front side protective film 81 and back side protective film 82 are applied in film-form over most of the front and back surfaces of the substrate 10. These protective films 81 and 82 are 25 $\mu$m to 1000 $\mu$m thick film sheets of material such as polyethylene terephthalate (PET) or fluoride resin. Adhesive layers 83 and 84 (20 $\mu$m to 100 $\mu$m thick), which are made of thermoplastic resin such as ethylene vinyl acetate copolymer (EVA), are applied to one side of the protective films 81 and 82. The front side and back side protective films 81 and 82 are simultaneously laminated onto the substrate by passage through heat rollers instead of this laminating method, the protective films can also be applied by using a vacuum thermocompression bonding method where they are pressure attached under vacuum while being heated. Further, material such as ethylene vinyl acetate copolymer (EVA) or polyvinyl butyral (PVB) may also be used for the adhesive layers.

Next, circular openings 85a and 85d (approximately 1 mm to 2 mm in diameter) are provided from the back side protective film 82 to the conducting paste terminals 50a and 50d. As a result, the back side of the conducting paste terminals 50a and 50d are exposed inside the openings 85a and 85d. Concerning the method of providing openings 85a and 85d, a cut-out method using a circular periphery cutter (Thomson type cutter) is employed. The stroke of the cutter is adjusted so that the tip of the cutter blade reaches, and cuts slightly into the conducting paste terminals 50a and 50d during the cut-out operation. In this type of cut-out method, the stroke of the cutter can be adjusted in increments of approximately 10 $\mu$m. Since the total thickness of the conducting paste terminals 50a and 50d described above is approximately 20 $\mu$m to 60 $\mu$m, by adjusting the cutter stroke so that the cutter will not pierce through the conducting paste terminals 50a and 50d, and reaches to a slight degree of cut into the conducting paste terminals, process dispersion in this step during mass production (i.e. in some cases the cutter does not reach the conducting paste terminals 50a and 50d and in some cases the cutter passes through the conducting paste terminals 50a and 50d) can be absorbed and openings 85a and 85d, as shown in FIG. 7, can be established. Further, concerning the shape of the openings 85a and 85d, or more specifically the shape of the cutter, it is not limited to a circular shape and shapes such as square or polygonal may also be used.

In the cut-out region (regions of openings 85a and 85d), adhesive strength between the transparent conducting film 40 and conducting paste terminals 50a and 50d is relatively low. Conversely, since the conducting paste terminals 50a and 50d include powder particulates, their surfaces are rough and since the transparent protective layer 60 is disposed on that rough surface, attachment strength between the conducting paste terminals 50a and 50d and the transparent protective layers 60 is relatively high. Consequently, delamination happens easily at the interface between the transparent conducting layers 40 and the conducting paste terminals 50a and 50d, and the laminate core within the openings 85a and 85d (in detail, the transparent conducting layers 40, the light-active semiconductor layer 30, the substrate 10, the adhesive layer 84, and the back side protective film 82) can be easily removed.

Figure 8A:
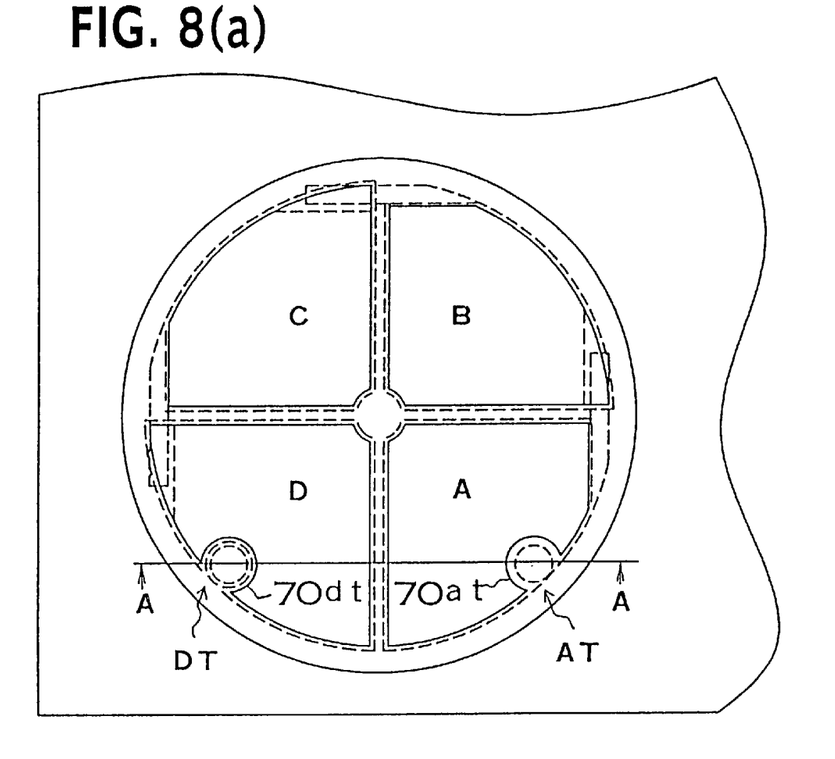
Figure 8B:
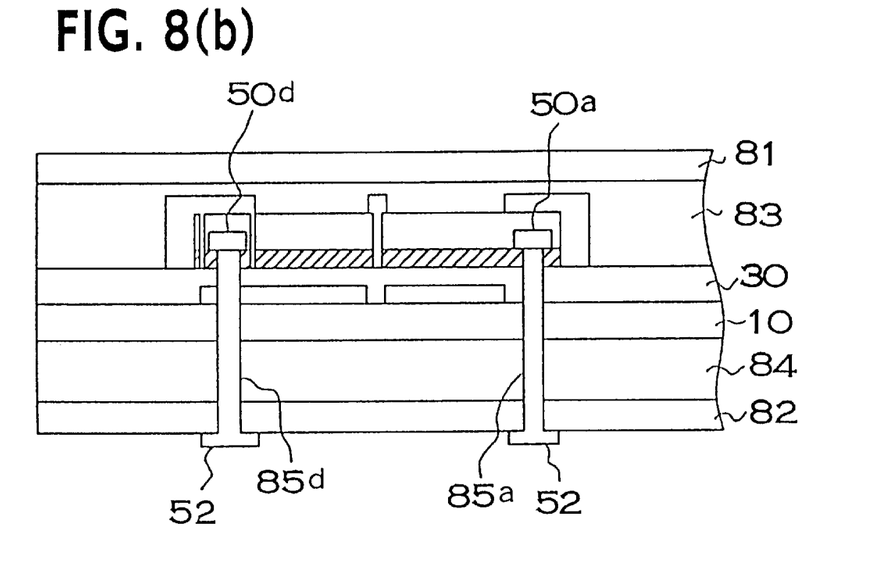

Next, in the process step shown in FIG. 8, conductive material 52, which is conductive paste, is established inside each of the openings 85a and 85d from the back side.

Figure 9A:
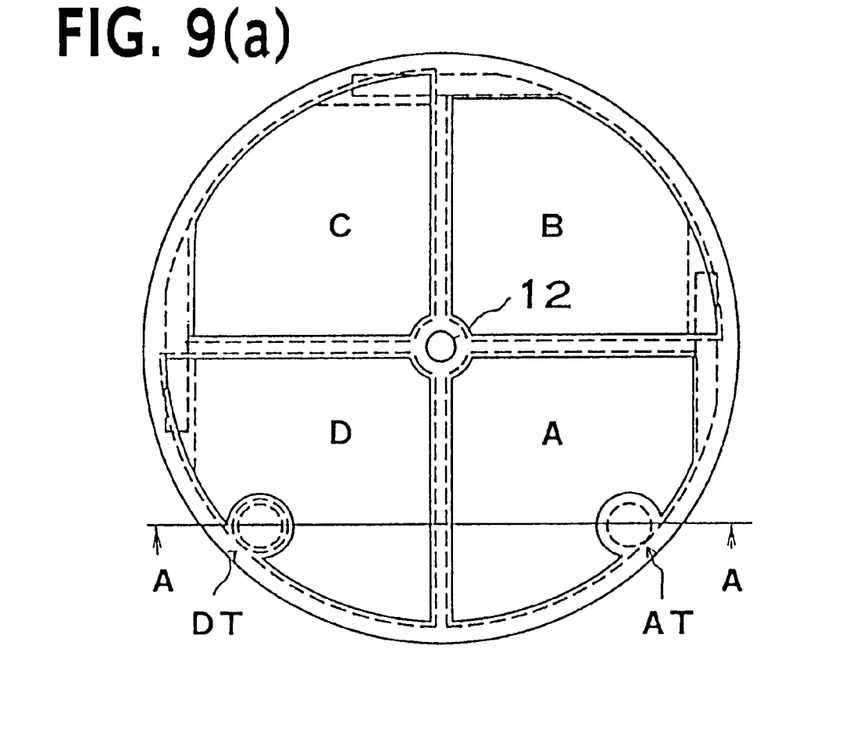
Figure 9B:
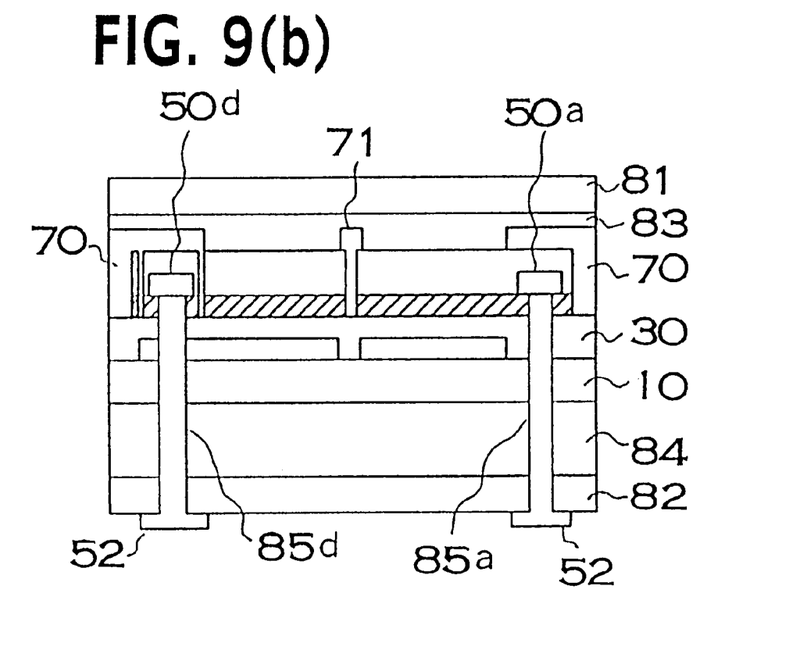

Subsequently in the process step shown in FIG. 9, the individual photovoltaic devices can be completed by cutting near the periphery of the resin protective material 70 disposed around the power generating regions A through D using a method such as the Thomson cutter method to remove the photovoltaic devices of the present invention from the substrate 10. By cutting and making a central hole 12 at the same time, this hole 12 can be used to pass an axis for watch or clock hands when the photovoltaic device is used as a power source for a watch or clock.

In the embodiment described above, the transparent protective layer is used as masking material for patterning the transparent conducting film. In addition, since this transparent protective layer is not removed, but rather is left in place to be used as the photovoltaic device protective layer, photovoltaic device reliability is improved.

Regions where the transparent conducting films are removed because they are not masked by the transparent protective layers, are wider than prior-art technology dividing grooves (50 $\mu$m to 100 $\mu$m), which are made by the removal of at least the transparent conducting film by spot laser beam scanning. Therefore, protective material disposed in the regions where the transparent conducting films are removed can sufficiently adhere to the light-active semiconductor layer, delamination of protective material in these regions does not occur during use of long period or reliability testing, and moisture intrusion is thereby low.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims or equivalence of such meets and bounds thereof are therefore intended to be embraced by the claims.

What is claimed is:

1. A method of manufacturing a photovoltaic device having a first electrode layer, a light-active semiconductor layer, and a transparent conducting layer in at least one power generating region on a substrate having an insulating surface, the method comprising the steps of:

forming said first electrode layer and said light-active semiconductor layer on the insulating surface;

forming a transparent conducting film over most of the insulating surface including the region of the light-active semiconductor layer, said transparent conducting film constituting said transparent conducting layer;

forming a patterned transparent protective layer being passed by visible light but not passed by ultraviolet light, as masking material on said transparent conducting film over said power generating regions; and     forming said transparent conducting layer by removing portions of said transparent conducting film not masked by the patterned transparent protective layer by irradiating ultraviolet laser light over most of the substrate, whereby after the above steps, said patterned transparent protective layer is left.

2. A method of manufacturing a photovoltaic device as recited in claim 1 further comprising applying protective material in the portions of the transparent conducting film removal.

3. A method of manufacturing a photovoltaic device as recited in claim 1 wherein said transparent protective layer is made from polyethylene terephthalate resin.

4. A method of manufacturing a photovoltaic device as recited in claim 1 wherein the substrate is a metal sheet with a insulating resin film formed on it.

5. A method of manufacturing a photovoltaic device as recited in claim 1 wherein the substrate is a resin film.

6. A method of manufacturing a photovoltaic device as recited in claim 1 wherein the first electrode layer is a metallic film.

7. A method of manufacturing a photovoltaic device as recited in claim 1 wherein the transparent conducting film is one of zinc oxide (ZnO), indium tin oxide (ITO), and tin oxide ($SnO_2$).

8. A method of manufacturing a photovoltaic device as recited in claim 7 wherein the transparent conducting film is indium tin oxide (ITO) of about 700 Å.

9. A method of manufacturing a photovoltaic device as recited in claim 1 wherein the transparent protective layer is formed by screen printing.

10. A method of manufacturing a photovoltaic device as recited in claim 3 wherein polyethylene terephthalate resin starting material is screen printed and heat dried to form the transparent protective layer.

11. A method of manufacturing a photovoltaic device as recited in claim 1 the thickness of the transparent protective layer is approximately greater than or equal to 3 $\mu$m.

12. A method of manufacturing a photovoltaic device as recited in claim 1 wherein there are more than or equal to two of the power generating regions, and gap width between the adjacent transparent protective layers corresponding to the adjacent power generating regions is greater than or equal to 0.2 mm.

13. A method of manufacturing a photovoltaic device as recited in claim 1 wherein the ultraviolet laser light is a sheet-beam of eximer laser light, and the eximer laser light is scanned.

14. A method of manufacturing a photovoltaic device as recited in claim 13 wherein the sheet-beam of the eximer laser output is 0.017~0.027 J/(pulse·mm$^2$) of KrF laser.

15. A method of manufacturing a photovoltaic device as recited in claim 13 wherein the eximer laser has a 30 Hz pulse and 12 mm/sec scanning speed.

16. A method of manufacturing a photovoltaic device as recited in claim 2 wherein the protective material is applied by a screen printing method.

17. A method of manufacturing a photovoltaic device as recited in claim 2 wherein protective material is provided in the periphery area of the power generating region.

18. A method of manufacturing a photovoltaic device as recited in claim 2 wherein there are more than or equal to two of the power generating regions, the protective material is provided in the gap between the power generating regions.

19. A method of manufacturing a photovoltaic device as recited in claim 2 wherein the protective material is either acrylic resin or polyethylene terephthalate (PET) resin.

20. A method of manufacturing a photovoltaic device as recited in claim 2 wherein the thickness of the protective material is 2 $\mu$m to 10 $\mu$m.

21. A method of manufacturing a photovoltaic device as recited in claim 2 wherein the protective material is transparent.

22. A method of manufacturing a photovoltaic device as recited in claim 2 wherein the protective material has coloration.

23. A method of manufacturing a photovoltaic device as recited in claim 2 wherein the protective material has brown coloration.

24. A method of manufacturing a photovoltaic device having a first electrode layer, a light-active semiconductor layer, and a transparent conducting layer in at least one power generating region and an electrode terminal area being electrically connected to the power generating region on a substrate having an insulating surface, the method comprising the steps of:

forming said first electrode layer and said light-active semiconductor layer on the insulating surface;

forming a transparent conducting film over most of the insulating surface including the region of the light-active semiconductor layer, said transparent conducting film constituting said transparent conducting layer;

forming a patterned transparent protective layer being passed by visible light but not passed by ultraviolet light, as masking material on said transparent conducting film over said power generating regions and said electrode terminal area; and forming said transparent conducting layer by removing portions of said transparent conducting film not masked by the patterned transparent protective layer by irradiating ultraviolet laser light over most of the substrate, whereby after the above steps, said patterned transparent protective layer is left.

25. A method of manufacturing a photovoltaic device as recited in claim 24 further comprising applying protective material in the portions of the transparent conducting film removal.

26. A method of manufacturing a photovoltaic device as recited in claim 24 wherein a conducting paste terminal is provided on the surface of the transparent conducting layer in the terminal area.

27. A method of manufacturing a photovoltaic device as recited in claim 26 further forming a transparent sheet back side protective film on the substrate back side, forming openings from the back side protective film to the conducting paste terminal, and disposing conducting material in the opening.

28. A method of manufacturing a photovoltaic device as recited in claim 27 wherein the opening from the back side protective film to the conducting paste terminal is formed by a periphery cutter.

* * * * *